(12) United States Patent
Ueda et al.

(10) Patent No.: US 9,466,475 B2
(45) Date of Patent: Oct. 11, 2016

(54) ASHING DEVICE

(71) Applicant: ULVAC, INC., Kanagawa (JP)

(72) Inventors: Masahisa Ueda, Susono (JP); Takashi Kurimoto, Susono (JP); Kyuzo Nakamura, Chigasaki (JP); Koukou Suu, Susono (JP); Toshiya Yogo, Kasugai (JP); Kazushige Komatsu, Kasugai (JP); Nobusuke Tachibana, Kasugai (JP)

(73) Assignee: ULVAC, INC., Kanagawa (JP)

( * ) Notice: Subject to any disclaimer, the term of this patent is extended or adjusted under 35 U.S.C. 154(b) by 124 days.

(21) Appl. No.: 14/498,402

(22) Filed: Sep. 26, 2014

(65) Prior Publication Data
US 2015/0013715 A1    Jan. 15, 2015

Related U.S. Application Data

(63) Continuation of application No. 12/443,912, filed as application No. PCT/JP2008/069681 on Oct. 29, 2008, now abandoned.

(30) Foreign Application Priority Data

Nov. 5, 2007    (JP) ................................ 2007-287341

(51) Int. Cl.
| | |
|---|---|
| H01L 21/02 | (2006.01) |
| G03F 7/42 | (2006.01) |
| H01J 37/32 | (2006.01) |
| H01L 21/311 | (2006.01) |

(52) U.S. Cl.
CPC ......... *H01L 21/02068* (2013.01); *G03F 7/427* (2013.01); *H01J 37/32192* (2013.01); *H01J 37/32467* (2013.01); *H01J 37/32477* (2013.01); *H01L 21/31138* (2013.01)

(58) Field of Classification Search
None
See application file for complete search history.

(56) References Cited

U.S. PATENT DOCUMENTS

| | | | |
|---|---|---|---|
| 4,512,283 A * | 4/1985 | Bonifield | ............ C23C 16/5096 118/50.1 |
| 4,626,447 A * | 12/1986 | Doehler | ................ C23C 16/517 118/50.1 |
| 5,210,055 A | 5/1993 | Nakaguma et al. | |
| 5,366,585 A | 11/1994 | Robertson et al. | |
| 5,494,522 A | 2/1996 | Moriya et al. | |
| 5,865,896 A | 2/1999 | Nowak et al. | |

(Continued)

FOREIGN PATENT DOCUMENTS

| | | |
|---|---|---|
| JP | 09-045495 | 2/1997 |
| JP | 10-189535 | 7/1998 |

(Continued)

OTHER PUBLICATIONS

MatWeb—http://matweb.com.

*Primary Examiner* — Allan Olsen
(74) *Attorney, Agent, or Firm* — Christensen Fonder P.A.

(57) ABSTRACT

An ashing device that prevents the ashing rate from changing over time. The ashing device ashes organic material on a substrate including an exposed metal in a processing chamber. The ashing device includes a path, which is formed in the processing chamber and through which active species supplied to the processing chamber pass. The path is defined by a surface on which the metal scattered from the substrate by the active species is collectible, with the surface being formed so as to expose a metal that is of the same kind.

8 Claims, 6 Drawing Sheets

(56) References Cited

U.S. PATENT DOCUMENTS

| | | | |
|---|---|---|---|
| 5,959,409 A | 9/1999 | Dornfest et al. | |
| 6,019,060 A * | 2/2000 | Lenz | H01J 37/32623 118/723 R |
| 6,156,151 A | 12/2000 | Komino et al. | |
| 6,162,323 A * | 12/2000 | Koshimizu | H01J 37/3244 118/723 I |
| 6,537,419 B1 | 3/2003 | Kinnard | |
| 6,602,381 B1 * | 8/2003 | Lenz | H01J 37/32623 118/715 |
| 6,902,683 B1 * | 6/2005 | Kaji | H01J 37/32082 156/345.47 |
| 9,059,105 B2 * | 6/2015 | Ueda | H01J 37/3244 |
| 2002/0036064 A1 | 3/2002 | DeOrnellas et al. | |
| 2002/0130164 A1 * | 9/2002 | Matsuki | B23K 1/008 228/206 |
| 2003/0121609 A1 | 7/2003 | Ohmi et al. | |
| 2004/0144490 A1 | 7/2004 | Zhao et al. | |
| 2005/0006346 A1 | 1/2005 | Annapragada et al. | |
| 2005/0257743 A1 * | 11/2005 | Koshiishi | H01J 37/32082 118/723 E |
| 2005/0269292 A1 * | 12/2005 | Koshiishi | H01J 37/32027 216/67 |
| 2006/0000803 A1 * | 1/2006 | Koshiishi | H01J 37/32082 216/67 |
| 2006/0219361 A1 | 10/2006 | Wang et al. | |

FOREIGN PATENT DOCUMENTS

| | | |
|---|---|---|
| JP | 2002-110642 | 4/2002 |
| JP | 2003-515960 | 5/2003 |
| JP | 2003-318155 | 11/2003 |
| TW | 200507104 | 2/2005 |
| TW | 200710985 | 3/2007 |

* cited by examiner

ASHING DEVICE

CROSS-REFERENCE TO RELATED APPLICATIONS

The present application is a continuation application of U.S. application Ser. No. 12/443,912, filed Apr. 1, 2009, which is a national stage entry of WO Application No. PCT/JP2008/069681, filed Oct. 29, 2008, which claims priority to JP Application No. 2007-287341, filed Nov. 5, 2007, all of which are hereby incorporated by reference herein in their entirety.

FIELD OF THE INVENTION

The present invention relates to an ashing device for performing ashing (incineration) to remove organic materials from a substrate.

BACKGROUND OF THE INVENTION

In the prior art, to form an integrated circuit on a semiconductor substrate, a resist film on which is formed a circuit pattern is arranged on the surface of a semiconductor substrate. Then, layers under the resist film, such as an insulation film, a semiconductor film, or a metal film, are etched through the resist film. The resist film is removed from the substrate surface after ending the etching process. One example of a method for removing the resist film is a dry processing method for ashing (incinerating) the resist film using the plasma of reactive gas, mainly oxygen plasma.

The dry processing method causes reaction of active species (radicals), mainly oxygen radicals, generated in the plasma of the reactive gas, in the resist film applied to the substrate, to decompose and vaporize the resist film to $CO_2$ and $H_2O$ for removal. Patent document 1 discloses an example of a plasma ashing device for removing a resist film through the dry processing method. This ashing device will be described with reference to FIG. 9.

As shown in FIG. 9, an ashing device includes a chamber (processing chamber) 1, the upper part of which is coupled to a feed tube 2. The feed tube 2 is connected to a plasma chamber (not shown), which generates plasma with microwaves and reaction gases (e.g., oxygen, nitrogen, and carbon tetrafluoride) A shower plate 3, which includes a plurality of through holes, is arranged at the lower end of the feed tube 2 facing toward a substrate stage 4. A cylindrical diffusion prevention wall 5 is attached to an upper inner surface of the processing chamber 1 so as to extend around the shower plate 3. A high frequency power supply 6 is connected to the substrate stage 4. A ventilation port 7 is formed at the bottom of the chamber 1.

The ashing process performed by the ashing device formed in such a manner will now be described. First, a substrate (wafer) W loaded into the chamber 1 is arranged on an upper surface of the substrate stage 4. The interior of the chamber 1 is depressurized, and high frequency voltage (RF bias) is applied to the substrate stage 4. Then, gas containing oxygen radicals is supplied to the chamber 1 through the feed tube 2 from the plasma chamber (not shown). The gas containing oxygen radicals flows through the through holes of the shower plate 3 and reaches the substrate W. The gas flowing outward from the shower plate 3 is guided by the diffusion prevention wall 5 towards the substrate W. A resist film (not shown) formed on the upper surface of the substrate W is decomposed and vaporized by the oxygen radicals contained in the gas and then discharged from the ventilation port 7.

In the integrated circuit on the semiconductor substrate, circuit elements such as transistors are connected by a metal wiring of aluminum (Al), copper (Cu,), or the like. Some integrated circuits have connection pads of which surfaces are covered by gold (Au) or the like or connection terminals formed from solder. Thus, when manufacturing the semiconductor substrate, during the ashing of the resist film, the metal wiring may be exposed and gold or solder may be formed on the surface. In such a case, the exposed metal material is sputtered by chemical reactions or physical reactions. This scatters metal atoms, and the metal atoms collect on the inner walls of the chamber 1, that is, the lower surface of the shower plate 3 and the inner circumferential surface of the diffusion prevention wall 5. If the ashing process is continued in such a state, the metals collected on the inner walls of the chamber 1 bond with the oxygen radicals that should be guided to the substrate W. This oxidizes the metal surface and increases the amount of deactivated oxygen radicals. As a result, the amount of oxygen radicals that reaches the substrate W decreases, and the depth (ashing rate) of the resist film that can be processed during the same time decreases. Such a change in the ashing rate over time leads to a problem in which the ashing rate becomes unstable.

Actual processing was continuously performed on a large number of substrates W from which metal (here, copper) was exposed by using a single ashing device under the same conditions (condition B), and the inventors of the present invention have confirmed that the ashing rate drastically decreases as the quantity of processed substrates W increases, as shown in FIG. 10. More specifically, the ashing rate of the substrate W that was processed first after washing the ashing device was 2100.5 [Å/60 sec], whereas the ashing rate of the twentieth substrate W decreased to 1523.7 [Å/60 sec]. In other words, in the ashing process performed on the twentieth substrate W, the ashing rate decreased by about 30% compared to when processing the first substrate W.

Patent Document 1: Japanese Laid-Open Patent Publication No. 9-45495

SUMMARY OF THE INVENTION

The present invention provides an ashing device that prevents the processing efficiency from decreasing over time.

One aspect of the present invention is an ashing device. The ashing device ashes organic material on a substrate including an exposed metal in a processing chamber. The ashing device includes a path through which active species supplied to the processing chamber pass. The path is defined by a surface on which the metal scattered from the substrate by the active species is collectible, with the surface being formed so as to expose the same kind of metal as the metal exposed from the substrate.

DETAILED DESCRIPTION OF THE PREFERRED EMBODIMENTS

An ashing device according to an embodiment of the present invention will now be discussed with reference to FIGS. 1 to 3.

Figure 1:
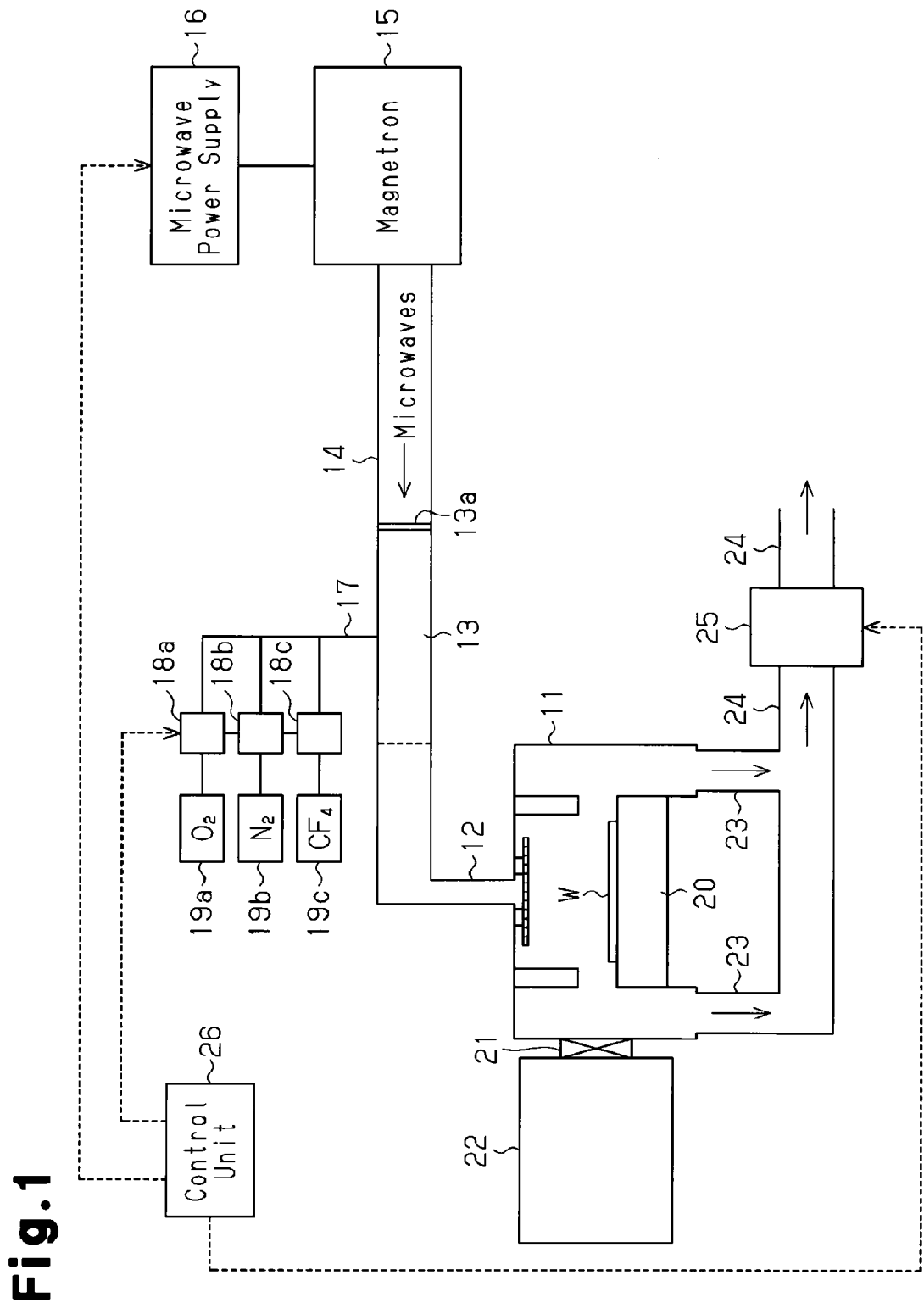
FIG. 1 is a schematic diagram of a first embodiment of an ashing device.

As shown in FIG. 1, the ashing device includes a chamber (processing chamber) 11, the upper part of which is connected to a plasma chamber 13 by a feed tube 12. The plasma chamber 13 is connected to a magnetron 15 by way of a microwave waveguide 14. A microwave transmissive window 13a, which is formed from silica or the like, partitions the plasma chamber 13 and the microwave waveguide 14. A microwave power supply 16 is connected to the magnetron 15. Microwaves (μ waves) generated in the magnetron 15 are guided to the plasma chamber 13 through the microwave waveguide 14.

The plasma chamber 13 is connected to a plurality of (three in the drawing) mass flow controllers 18a to 18c by a gas intake tube 17. The mass flow controllers 18a to 18c are respectively connected to gas supply sources 19a to 19c. In the present embodiment, the gas supply source 19a stores oxygen ($O_2$), the gas supply source 19b stores nitrogen ($N_2$), and the gas supply source 19c stores carbon tetrafluoride ($CF_4$). The mass flow controllers 18a to 18c adjust the flow rate of the gas stored in the corresponding gas supply sources 19a to 19c. The oxygen, nitrogen, and carbon tetrafluoride under the predetermined flow rate are mixed to form a reactive gas, which is sent to the plasma chamber 13 through the gas intake tube 17.

The microwaves and reactive gas generate plasma, which contains oxygen, in the plasma chamber 13, and oxygen radicals, which serve as active species in the plasma, are sent to the chamber 11 through the feed tube 12. A substrate stage 20 for holding a substrate W is arranged in the chamber 11. A vacuum auxiliary chamber 22 is connected to the chamber 11 by a gate 21. The vacuum auxiliary chamber 22 is used to load and unload the substrate W without opening the chamber 11 to the atmosphere.

A ventilation port 23 is formed in the bottom of the chamber 11. The ventilation port 23 is connected to a ventilation pump (not shown) by a ventilation tube 24. The ventilation pump reduces the pressure in the chamber 11. A pressure controller 25 is arranged in the ventilation tube 24 to regulate the pressure in the chamber 11 with the ventilation pump.

The microwave power supply 16, the mass flow controllers 18a to 18c, and the pressure controller 25 are connected to a control unit 26. The control unit 26 includes a storage (not shown). The storage stores information (recipes) on the conditions for processing various types of substrates. When the recipe that is in accordance with the substrate W loaded into the chamber 11 is designated, the control unit 26 controls the microwave power supply 16, the mass flow controllers 18a to 18c, and the pressure controller 25 based on values of the designated recipe.

The structure of the chamber 11 will now be described in detail with reference to FIG. 2.

The chamber 11 is formed from the same kind of metal as the metal mainly exposed from the substrate W processed in the chamber 11. Further, this metal is exposed from the inner surface of the chamber 11. For example, if the ashing device performs the ashing process on the substrate W from which copper is exposed, the chamber 11 is formed from copper. Accordingly, in addition to copper (Cu), the chamber 11 may also be formed from gold (Au), solder, platinum (Pt), and iridium (Ir) in accordance with the metal exposed from substrate W.

Figure 2:
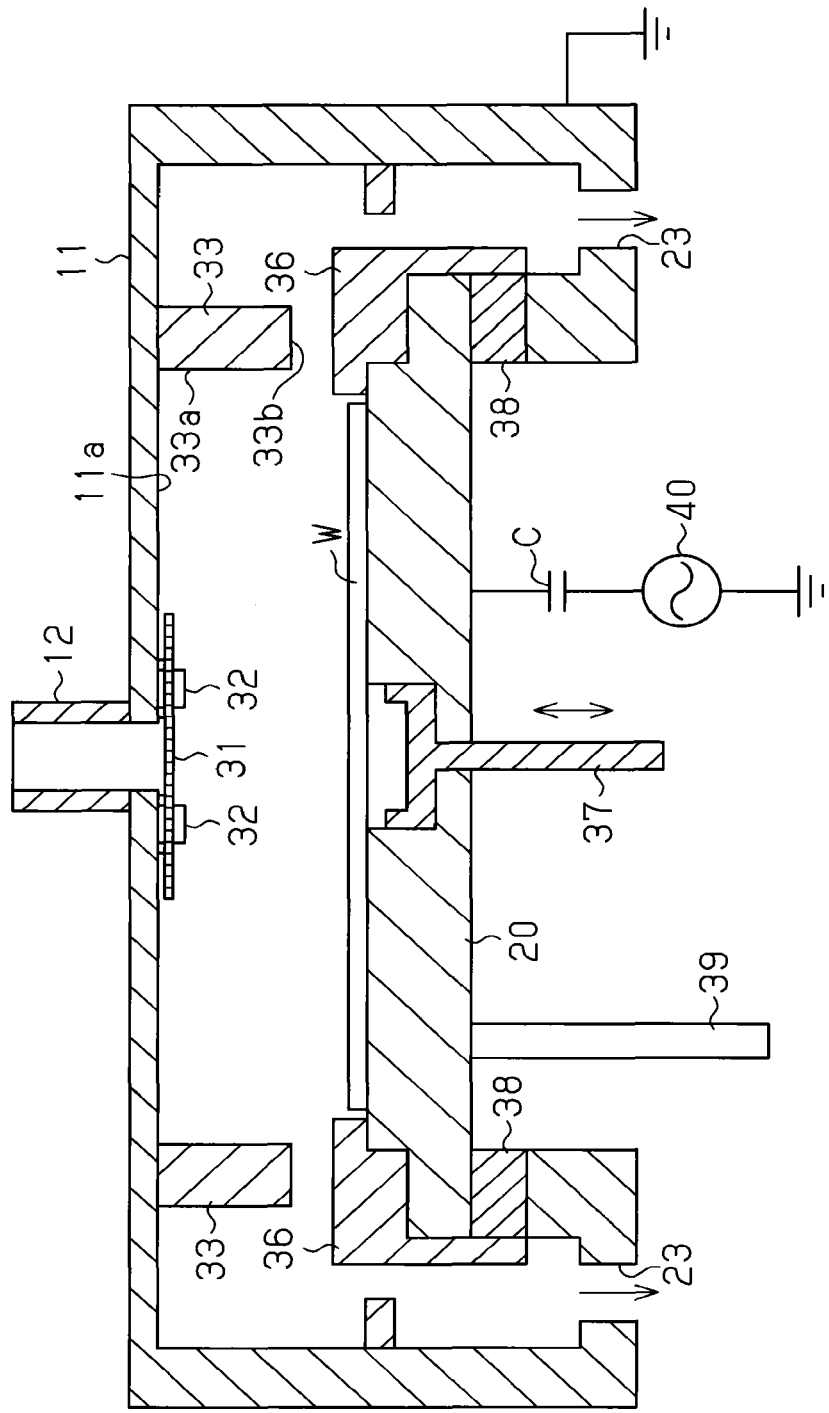
FIG. 2 is a schematic cross-sectional view of a chamber arranged in the ashing device of FIG. 1.

As shown in FIG. 2, the feed tube 12 has a lower end coupled to the upper part of the chamber 11. A shower plate (diffusion plate) 31 is arranged on the lower end of the feed tube 12. The shower plate 31, which is disk-shaped and which includes a plurality of through holes (not shown), faces toward the substrate stage 20. The shower plate 31 is fixed to the upper part of the chamber 11 by attachment members 32. The attachment members 32 space the shower plate 31 apart from an upper inner surface 11a by a predetermined distance. The distance between the upper inner surface 11a of the chamber 11 and the shower plate 31 is set so that oxygen radicals sent into the chamber 11 from the feed tube 12 pass through the through holes formed in the shower plate 31 and pass through the gap formed between the shower plate 31 and the upper part of the chamber 11 to be guided outward.

Figure 3A:
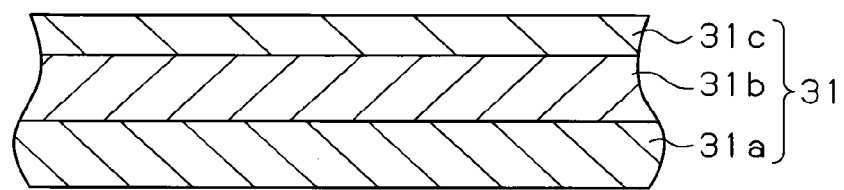
FIG. 3(a) is a cross-sectional view of a shower plate.

As shown in FIG. 3(a), the shower plate 31 includes a plurality of (three as shown in FIG. 3(a)) layers 31a, 31b, and 31c. In the same manner as the chamber 11, the first layer 31a, which is located at the side opposing the substrate W (lower side in FIGS. 2 and 3), is formed from the same kind of metal as the metal (e.g., copper) exposed from the substrate W, and this metal is exposed from the surface (lower surface) of the first layer 31a. The second layer 31b, which is an upper layer of the first layer 31a, is a metal oxide layer formed from, example, an aluminum oxide and ittria ($Y_2O_3$). The third layer 31c, which is an upper layer of the second layer 31b and located at an oxygen radical entering side (upper side as viewed in FIGS. 2 and 3), is formed by a fluoride layer (fluoride film).

The shower plate 31 is formed, for example, by applying a metal oxide layer, which becomes the second layer 31b, to a metal plate (first layer 31a), which is formed from the metal that is exposed from the substrate W. Then, a fluorination treatment is performed on the upper surface of the second layer 31b to form the third layer 31c. The fluorination treatment may be performed, for example, by raising the temperature of a subject member (first layer 31a and second layer 31b) and supplying gas that contains fluorine atoms. As another example, fluorine plasma may be produced by using gas containing fluorine atoms, and the subject member may be arranged in such a plasma atmosphere. The gas that is used may contain at least one of $CF_4$, $C_2F_6$, $C_3F_8$, $NF_3$, and $SF_6$.

Referring to FIG. 2, a cylindrical diffusion prevention wall 33 has an upper end attached to the upper inner surface 11a of the chamber 11. The diffusion prevention wall 33 extends around the shower plate 31. The diffusion prevention wall 33 has an inner diameter set to be slightly larger than the outer diameter of the substrate W held on the substrate stage 20. In the same manner as the chamber 11 and the shower plate 31, the diffusion prevention wall 33 is formed from the same kind of metal as the metal (e.g., copper) exposed from the substrate W, and this metal is exposed from the surface of the diffusion prevention wall 33.

A substrate guide 36 covers the upper peripheral part of the substrate stage 20. A lift pin 37 has a distal end arranged in the substrate stage 20 and supported to be movable in upward and downward directions. Upward and downward movement of the lift pin 37 transfers the substrate W between the lift pin 37 and a conveying device (not shown) and arranges the substrate W on the substrate stage 20.

An insulation plate 38 is arranged between the substrate stage 20 and the lower part of the chamber 11. A pipe 39 is connected to the substrate stage 20. The pipe 39 supplies coolant to a coolant passage (not shown), which is formed in the substrate stage 20. This adjusts the temperature of the substrate stage 20. Further, a high frequency power supply 40 is connected to the substrate stage 20 via a capacitor C. The high frequency power supply 40 supplies a high frequency bias (RF bias) to the substrate stage 20.

The chamber 11 is connected to ground. Therefore, the chamber 11 (specifically, its inner surface) functions as an electrically opposite electrode of the substrate stage 20, to which is applied the high frequency bias from the high frequency power supply 40. Further, the chamber 11 is electrically connected to the first layer 31a (metal plate) of the shower plate 31 via the attachment members 32. The chamber 11 is also electrically connected to the diffusion prevention wall 33. Accordingly, the chamber 11, the shower plate 31, and the diffusion prevention wall 33, which are formed from the same kind of metal and to which the high frequency bias is applied, function as electrically opposite electrodes of the substrate stage 20.

An ashing process performed with the ashing device having the above-described structure will now be discussed.

First, the substrate W is arranged on the substrate stage 20 in the chamber 11 in a state in which the surface (processing surface) including the resist film (organic material) that is to be removed is arranged facing upward. Then, the pressure in the chamber 11 is reduced, and high frequency bias (RF bias) is applied to the substrate stage. Then, oxygen radicals contained in plasma and generated in the plasma chamber 13 are sent into the chamber 11. Oxygen radicals pass through the through holes of the shower plate 31 and reach the substrate. Oxygen radicals also pass through the gap between the shower plate 31 and the upper inner surface 11a of the chamber 11 and move in the radial direction. In this state, a fluoride layer (third layer 31c), which functions as a passivation film, is formed on the side of the shower plate 31 supplied with the oxygen radicals (upper surface as viewed in FIG. 2). Thus, the upper surface of the shower plate 31 resists oxidation and resists bonding with the oxygen radicals. This reduces the amount of oxygen radicals deactivated by the shower plate 31.

The oxygen radicals moving in the radial direction are guided by the diffusion prevention wall 33 to the substrate W. That is, the diffusion prevention wall 33 restricts movement of the oxygen radicals in the radial direction and prevents unnecessary diffusion of the oxygen radicals. When the oxygen radicals reach the substrate W, the oxygen radicals react with the resist film on the substrate. This removes the resist film.

As described above, when performing an ashing process on the substrate W from which a metal material is exposed, metal atoms are scattered from the substrate W when chemical reactions or physical reactions take place on the substrate surface. As a result, the metal atoms scattered from the substrate W are collected and deposited in the path of the metal atoms that includes the upper inner surface 11a of the chamber 11 that faces toward the substrate W, a lower surface of the shower plate 31, and an inner circumferential surface 33a and bottom surface 33b of the diffusion prevention wall 33. In such a state, in the ashing device of the prior art, the metal atoms collected and deposited in such a manner decreases the ashing rate and adversely affects the uniformity of the ashing rate in the plane of the substrate W. That is, the metal atoms collected and deposited on these surfaces, which is the path of the oxygen radicals, vary the amount of oxygen radicals deactivated on the surfaces. This varies the ashing rate.

With regard to this problem, the path of the oxygen radicals in the ashing device of the present embodiment including surfaces on which metal atoms scattered from the substrate W is collectible (the upper inner surface 11a of the chamber 11, the lower surface of the shower plate 31, and the inner circumferential surface 33a and bottom surface 33b of the diffusion prevention wall 33) is formed from the same kind of metal as the metal exposed from the substrate W. In addition, this metal is originally exposed from each of these surfaces. Thus, even if the metal atoms scattered from the substrate W collect on the surfaces, the area in which the metal is exposed subtly changes in these surfaces. Accordingly, even if metal atoms collect in the chamber 11, the amount of oxygen radicals that are deactivated are about the same as when metal atoms do not collect therein. Thus, the amount of deactivated oxygen radicals substantially remains the same regardless of the collection of metal atoms, or the ashing process of the plurality of substrates W. In other words, even if the ashing process is performed on many substrates W, the amount of oxygen radicals reaching the substrate W subtly changes. This prevents the ashing rate from changing over time.

Further, even if metal scattered from the substrate W is collected in a non-uniform manner on the upper inner surface 11a of the chamber 11, the lower surface of the shower plate 31, and the inner circumferential surface 33a and bottom surface 33b of the diffusion prevention wall 33, the same kind of metal is originally exposed from these surfaces. Thus, the area of these surfaces from which the metal is exposed subtly changes before and after the collection of the metal atoms. That is, even if the ashing process is performed on many substrates W, the metal distribution remains substantially the same in the path of the oxygen radicals. Accordingly, the amount of oxygen radicals that reach each point (measurement point) on the substrate subtly changes over time. This prevents the ashing rate at each point on the substrate W, in addition to the ashing rate of the entire substrate W, from changing over time. Further, the metal distribution in the path of the oxygen radicals substantially does not change. This prevents the in-plane uniformity of the ashing rate in the substrate W from being adversely affected.

Figure 5:
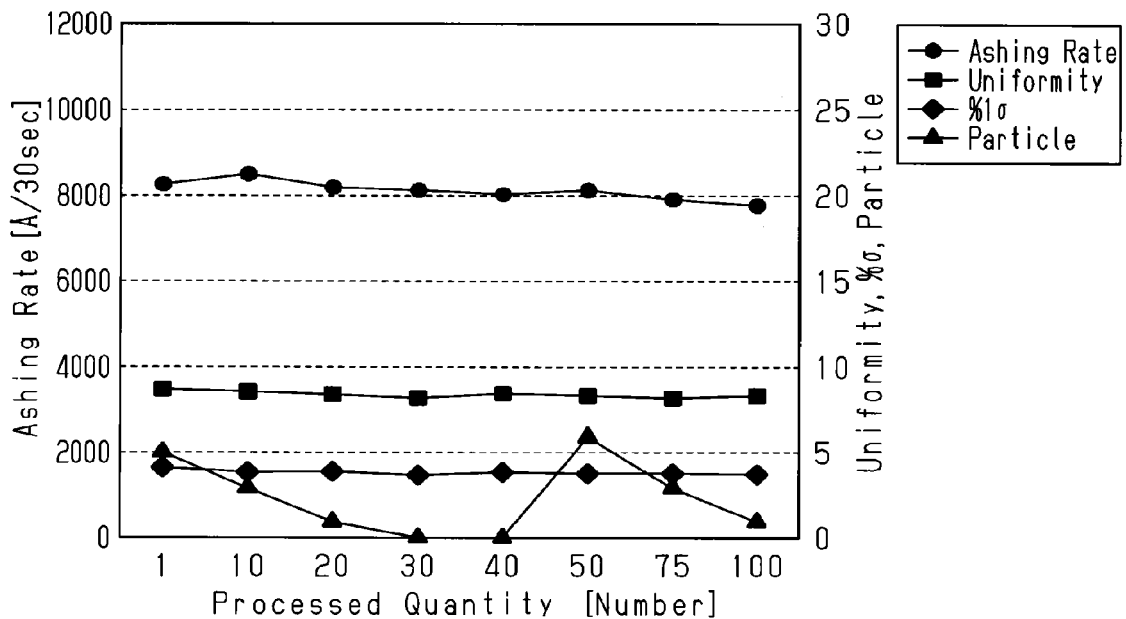
FIG. 5 is a chart showing changes in the ashing rate over time with the ashing device of FIG. 1.

FIG. 5 shows the results of an experiment conducted by continuously processing a large number of wafers W from which copper is exposed under the same conditions (condition A). The processing conditions A of the substrate W were set so that the flow rates for oxygen, nitrogen, and carbon tetrafluoride were respectively 2400 sccm, 160 sccm, and 400 sccm, the pressure in the chamber 11 was 100 Pa, the power of the microwaves was 2000 W, the RF bias was 300 W, and the processing time was 30 seconds.

Figure 10:
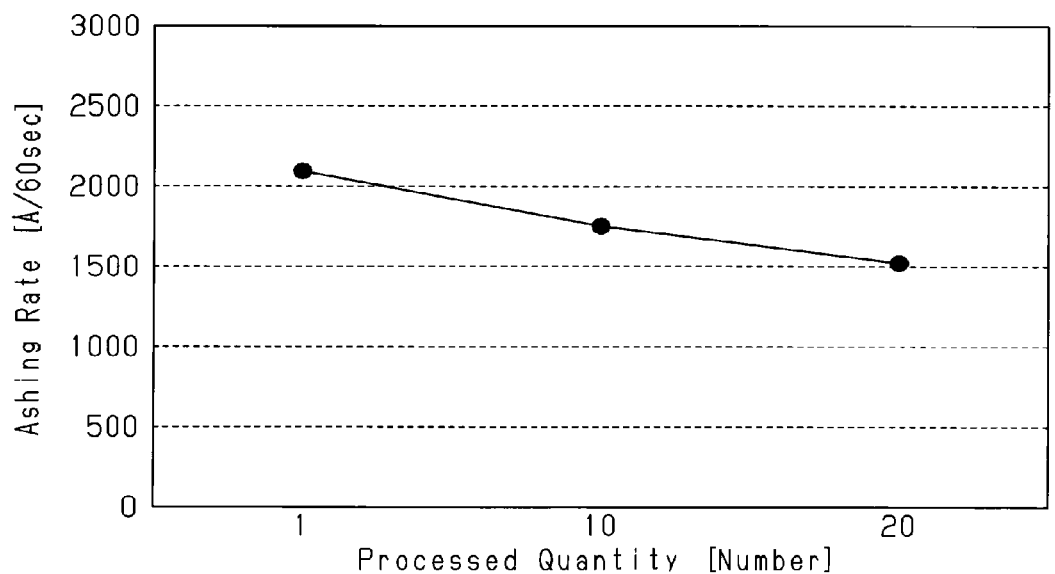
FIG. 10 is a chart showing changes in the ashing rate over time when using the ashing device of the prior art.

In FIG. 5, the black circles indicate the average value of the ashing rates measured at forty-nine measurement points on the substrate W (refer to FIG. 6), which are set in order from the center of the substrate W in the circumferential direction and the radial direction. As apparent from the results shown by the black circles, even if the processing quantity increases in the ashing device of the present embodiment, the change in the ashing rate is small, and the ashing rate remains generally constant. More specifically, the ashing rate of the substrate W that was processed first after washing the ashing device was 8244.3 [Å/30 sec], whereas the ashing rate of the one-hundredth substrate W was 7791.3 [Å/60 sec]. In other words, in the ashing rate of the present embodiment, even when performing the ashing process on one hundred substrates W, the ashing rate is decreased by only about 5% from the substrate W that is processed first. In comparison, in the ashing device of the prior art, as described above, the ashing rate is decreased by about nearly 30% (refer to FIG. 10). Accordingly in the ashing device of the present embodiment, it is apparent that changes in the ashing rate are small and the ashing rate is stable.

Figure 6:
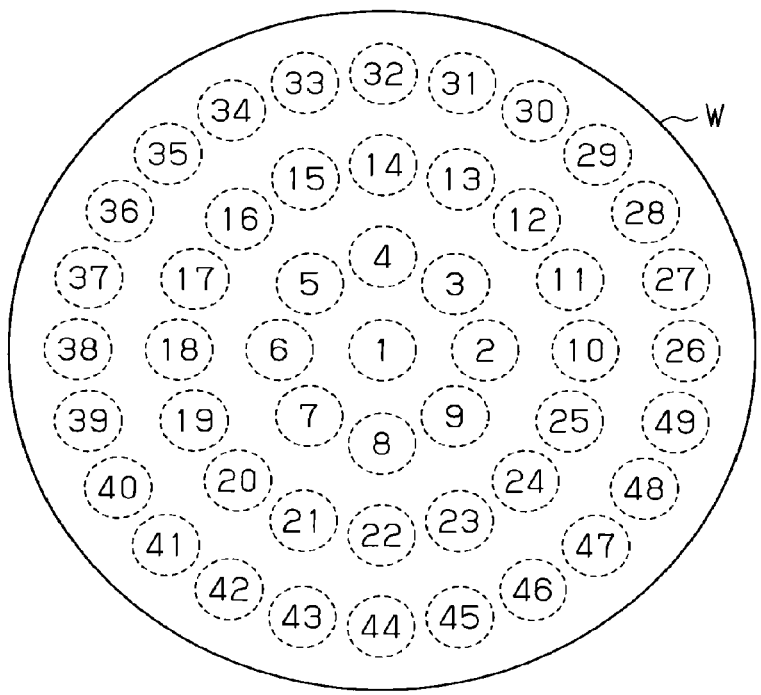
FIG. 6 is a plan view showing measurement points.

In FIG. 5, the black squares and the black diamonds show the uniformity of the ashing rate in the plane of the substrate W that is calculated from the difference between the maximum value and the minimum value in the ashing rate measured at each of the measurement points (refer to FIG. 6). The black triangles show the quantity of particles produced on the substrate. As apparent from these results, in the ashing device of the present embodiment, even if the processing quantity increases, the in-plane uniformity of the ashing rate remains generally the same, and the amount of particles that are produced is extremely small.

From the above experiment results, it is apparent that the ashing rate can be stabilized regardless of the processing quantity of the substrates W by forming surfaces so that the metal exposed from the surfaces is the same as the metal that collects on the surfaces. This improves the reliability and productivity of the ashing device.

Figure 7:
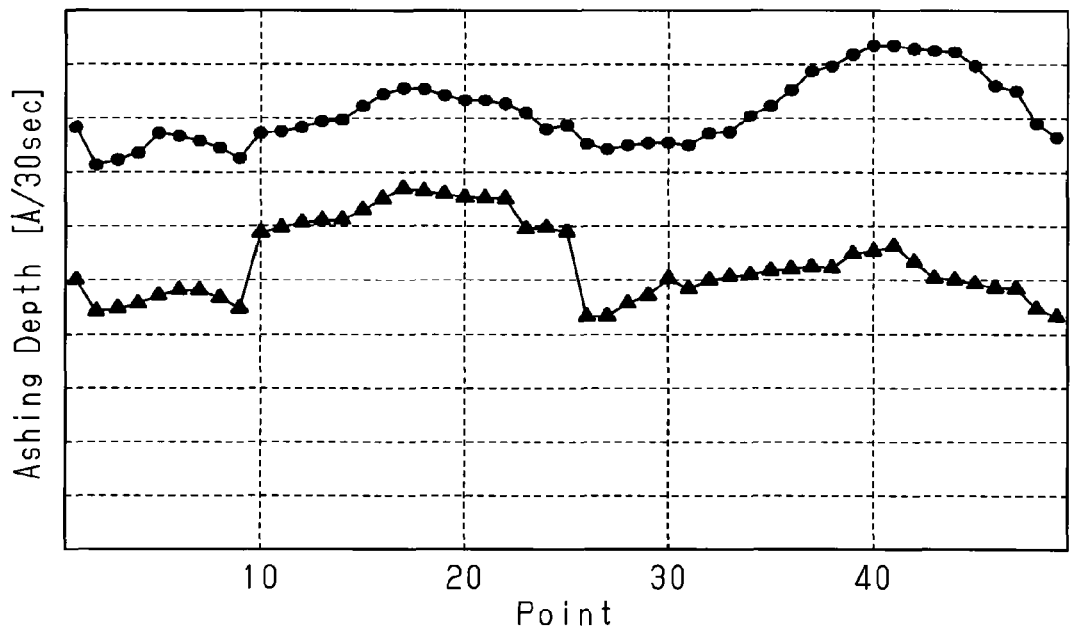
FIG. 7 is a chart showing the measurement results of the ashing depth at each measurement point when using an ashing device of the prior art.
Figure 8:
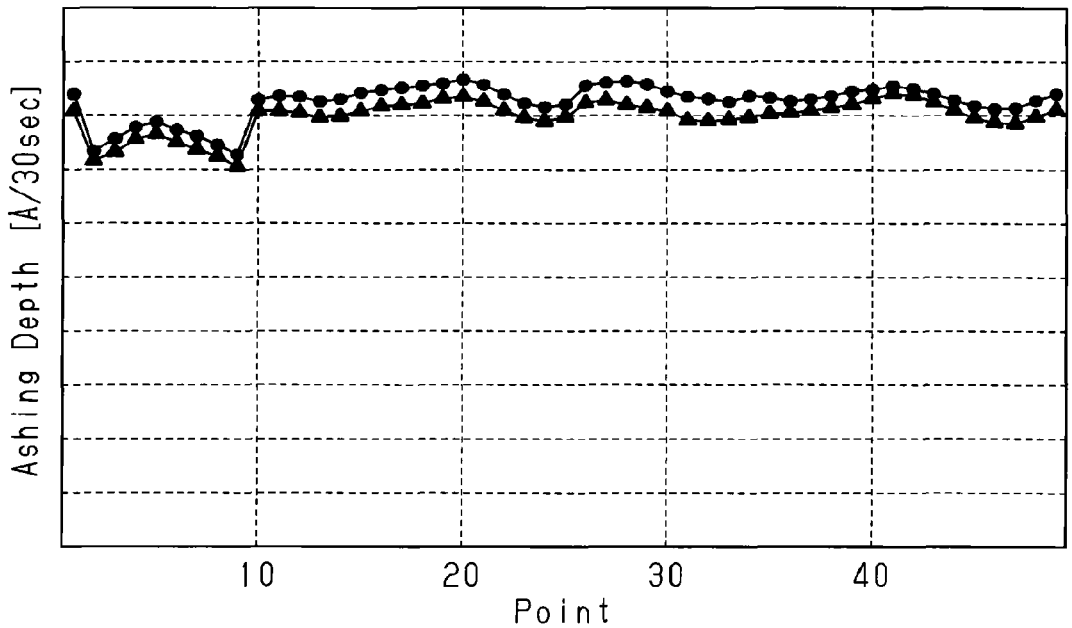
FIG. 8 is a chart showing the measurement results of the ashing depth at each measurement point when using the ashing device of the present embodiment.
Figure 9:
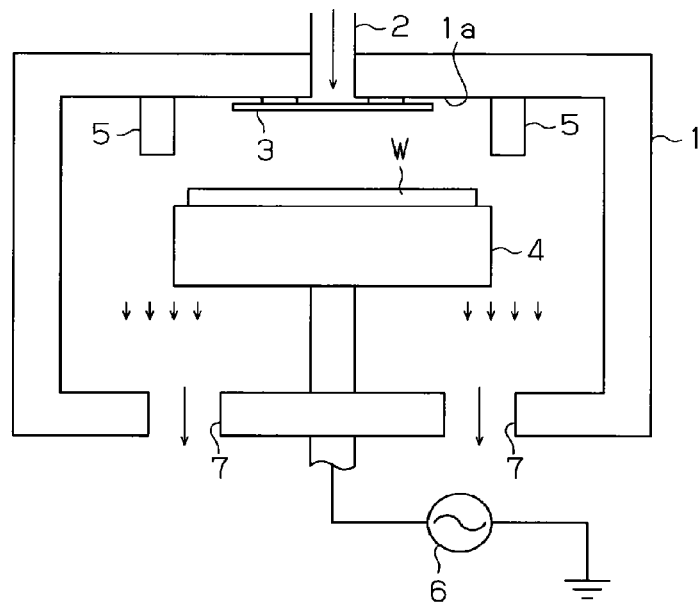
FIG. 9 is a schematic diagram of a prior art ashing device.

FIGS. 7 and 8 show the results of experiments conducted to measure the ashing depth during the ashing process at each measurement point (refer to FIG. 6) of the substrate W from which copper is exposed. FIG. 7 shows the measurement results when performing the ashing process with the ashing device of the prior art under condition B in which the flow rates for oxygen, nitrogen, and carbon tetrafluoride were respectively 1280 sccm, 160 sccm, and 160 sccm, the pressure in the chamber 11 was 75 Pa, the power of the microwaves was 1500 W, the RF bias was 300 W, and the processing time was 30 seconds. Further, FIG. 8 shows the measurement results when performing the ashing process with the ashing device of the present embodiment under the above-described condition A.

In FIGS. 7 and 8, the black circles show the measurement results of a first one of the substrates W that undergoes the ashing process after washing the ashing device, and the black squares show the measurement results for a plural ordinal number (e.g., one-hundredth) of the substrates W. As apparent from FIG. 7, in the ashing device of the prior art, the ashing depths for the plural ordinal number of the substrates W that has undergone the ashing process are entirely decreased from the ashing depths for the first one of the substrates W. Further, in the ashing process performed on the plural ordinal number of the substrates W, the amount of decrease in the ashing depth varies between each measurement point, and the uniformity of the ashing depth in the plane of the substrate W is adversely affected. It is understood that this is caused by the metal atoms that are collected in a non-uniform manner on the inner wall of the chamber 11.

In comparison, when using the ashing device of the present embodiment, as apparent from FIG. 8, when comparing the measurement results of the first one of the substrates with the measurement results of the plural ordinal number of the substrates W, the ashing depth subtly varied at each measurement point. In other words, the ashing rate remained generally the same as the first one of the substrates W at each measurement point on the plural ordinal number of the substrates W that has undergone the ashing process. As a result, by forming the surface on which metal is collectible so as to expose the same kind of metal, regardless of the processing quantity and measurement point of the substrate W, change in the ashing depth over time is prevented, and the in-plane uniformity of the ashing depth is prevented from being adversely affected.

The present embodiment has the advantages described below.

(1) A path for the oxygen radicals is formed in the processing chamber 11. The path is defined by surfaces on which metal atoms scattered from the substrate W is collectible (preferably, the upper inner surface 11a of the chamber 11, the lower surface of the shower plate 31, and the inner circumferential surface 33a and bottom surface 33b of the diffusion prevention wall 33), with the surfaces being formed so as to expose a metal that is the same as the metal exposed from the substrate W. Thus, even if metal atoms scattered from the substrate W collect on the surfaces, the area in which a metal is exposed subtly changes in the path of the oxygen radicals. Accordingly, even if metal atoms collect in the chamber 11, the amount of deactivated oxygen radicals is about the same as when metal atoms are not collected. That is, even if the ashing process is performed on a large number of substrates W, the amount of oxygen radicals that reach the substrate W subtly changes. Thus, the ashing rate is prevented from changing over time in an optimal manner. Thus, even when processing a large number of substrates W from which metal is exposed, the ashing rate remains stable in an optimal manner.

(2) The chamber 11 includes the diffusion prevention wall 33, which is cylindrical and which prevents unnecessary diffusion of oxygen radicals in a state surrounding the shower plate 31. Accordingly, the diffusion prevention wall 33 prevents unnecessary diffusion of oxygen radicals diffused outward from the shower plate 31 and efficiently supplies oxygen radicals to the substrate W.

(3) In the shower plate 31, the fluoride layer (third layer 31c) is formed on the surface, which serves as the entering side of the oxygen radicals. The fluoride layer functions as a passivation film so that the upper surface of the shower plate 31 resists oxidation. As a result, oxygen radicals subtly bond to the upper surface of the shower plate 31. Accordingly, due to the formation of the fluoride layer, the amount of oxygen radicals deactivated in the shower plate 31 is effectively decreased. This entirely improves the ashing rate.

(4) The chamber 11, the shower plate 31, and the diffusion prevention wall 33 function as electrically opposite electrodes of the substrate stage 20, to which high frequency bias from the high frequency power supply 40 is applied. Accordingly, the metal atoms scattered from the substrate W move toward the opposite electrodes. This further ensures that the metal atoms scattered from the substrate W are collected in the path of the oxygen radicals on the surfaces from which metal is exposed (the upper inner surface 11a of the chamber 11, the lower surface of the shower plate 31, the inner circumferential surface 33a of the diffusion prevention wall 33, and the bottom surface 33b).

The above-described embodiment may be modified as described below.

Figure 3B:
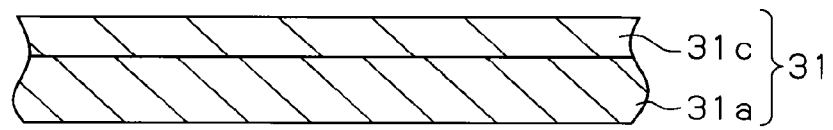
FIG. 3(b) is a cross-sectional view of a shower plate in a modification.

The layer structure of the shower plate 31 in the above-described embodiment is not especially limited. For example, as shown in FIG. 3(b), the shower plate 31 may be formed by applying a fluoride layer (third layer 31c) to the oxygen radical entering side surface (upper surface) of a metal plate (first layer 31a), which is formed from a metal exposed from the substrate W.

The third layer 31c, which is formed from a fluoride layer and shown in FIG. 3(a), may be eliminated. In such a case, the second layer 31b, which is formed by a metal oxide layer, functions as a passivation layer. Such a structure would also decrease the amount of deactivated oxygen radical in the shower plate 31 compared to a structure in which the shower plate 31 is formed by only the first layer 31a.

Alternatively, the second layer 31b and third layer 31c shown in FIG. 3(a) may be eliminated. In such a structure, the chamber 11, the shower plate 31, and the diffusion prevention wall 33, each of from which metal is exposed, would also prevent the ashing rate from changing over time.

Figure 4:
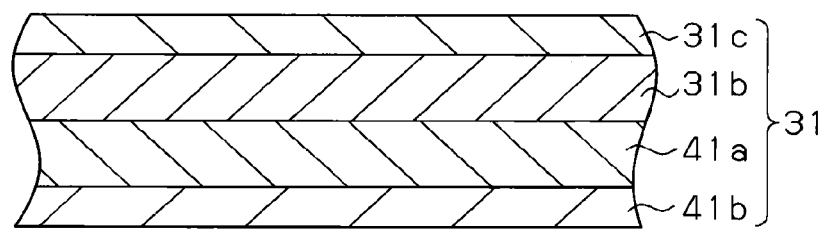
FIG. 4 is a cross-sectional view of the shower plate in the modification.

In the above-described embodiment, the shower plate 31 does not have to be formed from a metal plate (first layer 31a), which is formed from the same kind of metal as the metal exposed from the substrate W. For example, in the shower plate 31, the above-described metal may be sputtered, plated, sprayed, or vapor deposited to form a film on a surface (surface facing toward the substrate W) to which metal atoms scattered from the substrate W is collectible. More specifically, for example, referring to FIG. 4, the above-described metal may be sprayed onto a surface (lower surface), which faces toward the substrate W, of a metal plate 41a (e.g., aluminum plate) formed from a predetermined metal. This forms a metal film 41b with the above-described metal on the surface.

In the above-described embodiment, the formation of the third layer 31c of the shower plate 31 (fluorination treatment) is performed by a device that differs from the ashing device. However, the present invention is not limited in such a manner. For example, after attaching to the ashing device, the shower plate 31, which is formed from the first layer 31a and the second layer 31b, the shower plate 31 may undergo in the ashing device a fluorination treatment that uses fluorine-containing plasma.

Alternatively, in the chamber 11, which is formed from the same kind of metal as the metal exposed from the substrate W, for example, a surface oxidation treatment may be performed on a surface other than one that faces toward the substrate W.

In the above-described embodiment, the diffusion prevention wall 33 is entirely formed from the metal exposed from the substrate W. However, it is only required that the metal be exposed from surfaces to which the metal atoms scattered from the substrate W is collectible (inner circumferential surface 33a and bottom surface 33b). Accordingly, for example, the entire diffusion prevention wall 33 may be formed from a predetermined metal (e.g., aluminum), and spraying or the like may be performed to form a metal film of the above-described metal on only the inner circumferential surface 33a and bottom surface 33b of the diffusion prevention wall 33.

The attachment members 32 of the above-described embodiment may be formed from the same kind of metal as the metal exposed from the substrate W.

In the above-described embodiment, the diffusion prevention wall 33 may be eliminated.

In the above-described embodiment, the chamber 11, the shower plate 31, and the diffusion prevention wall 33 do not have to be connected to ground.

In the above-described embodiment, the present invention is embodied in an ashing device for removing resist film from a semiconductor wafer W. However, the present invention may be embodied in an ashing device for removing a film or organic material that is removable when using plasma or radicals.

In the above-described embodiment, the present invention is embodied in an ashing device that uses oxygen plasma. However, the present invention is not limited in such a manner and may be embodied in an ashing device that uses a different type of plasma (e.g., hydrogen plasma).

In the above-described embodiment, the present invention is embodied in a plasma ashing device that uses oxygen plasma. However, the present invention is not limited in such a manner and may be embodied, for example, in a light excitation ashing device that generates oxygen radicals by irradiating ozone gas with ultraviolet rays.

In the above-described embodiment, the structure of the ashing device may be varied as required. For example, the types of supplied gas may be increased.

The invention claimed is:

1. A method for using an ashing device, the method comprising:
   providing a processing chamber including a stage for holding a substrate;
   loading a substrate into the processing chamber, the substrate including a material disposed thereon that includes an organic material that is to be removed;
   arranging the substrate on the stage in the processing chamber;
   reducing pressure in the processing chamber;
   applying a high frequency bias to the stage; and
   supplying active species to the processing chamber for ashing the organic material on the substrate,
   wherein the step of providing a processing chamber includes defining a path through which active species supplied to the processing chamber pass,
   wherein the path is defined by surfaces on which metal scattered from the substrate by the active species during ashing of the organic material is collectible, with the surfaces being formed from a same electrically conductive metallic material, and
   wherein the metal scattered from the substrate by the active species during ashing of the organic material is of the same electrically conductive metallic material as the surfaces defining the path, and
   wherein the electrically conductive metallic material in the step of providing a processing chamber comprises a metal that is the same kind of metal as is scattered from the substrate in order to suppress a change in an amount of the active species deactivated by the scattered metal, the metal being selected from the group consisting of copper, gold, solder, platinum, and iridium.

2. The method according to claim 1 wherein the processing chamber provided in the step of providing is formed from a same kind of metal as scattered from the substrate.

3. A method for using an ashing device, the method comprising:
   providing a processing chamber, including: a stage for holding a substrate;

a diffusion plate attached to an inner surface of an upper portion of the processing chamber so as to face toward the stage and form a gap with the inner surface, in which the diffusion plate diffuses active species supplied to the processing chamber through the gap and includes a through hole for passage of active species therethrough; and a diffusion prevention wall which is cylindrical and which surrounds the diffusion plate, the diffusion prevention wall for preventing unnecessary diffusion of the active species away from the substrate held on the stage, wherein the inner surface of the upper portion of the processing chamber, a lower surface of the diffusion plate, and at least an inner circumferential surface and a bottom surface of the diffusion prevention wall are formed from a same electrically conductive metallic material;

loading a substrate into the processing chamber, the substrate including a material disposed thereon that includes an organic material that is to be removed;

arranging the substrate on the stage in the processing chamber;

reducing pressure in the processing chamber; applying a high frequency bias to the stage; and supplying active species to the processing chamber for ashing the organic material on the substrate, wherein metal exposed from the substrate during ashing of the organic material is of the same electrically conductive metallic material as the inner surface of the processing chamber, the lower surface of the diffusion plate, and the inner circumferential surface and the bottom surface of the diffusion prevention wall, and wherein the electrically conductive metallic material in the step of providing a processing chamber comprises a metal that is the same kind of metal as is scattered from the substrate in order to suppress a change in an amount of the active species deactivated by the scattered metal, the metal being selected from the group consisting of copper, gold, solder, platinum, and iridium.

4. The method according to claim 3, wherein the diffusion plate provided in the step of providing includes a surface supplied with the active species, and a passivation film is formed on the surface supplied with the active species.

5. The method according to claim 4, wherein the diffusion plate provided in the step of providing is a metal plate formed from the same kind of metal as the metal scattered from the substrate, in which the metal plate includes a lower surface facing toward the substrate and an upper surface supplied with the active species, with a metal oxide layer functioning as the passivation film being formed on the upper surface.

6. The method according to claim 4, wherein the diffusion plate provided in the step of providing is a metal plate formed from the same kind of metal as the metal scattered from the substrate, in which the metal plate includes a lower surface facing toward the substrate and an upper surface supplied with the active species, with a fluoride layer functioning as the passivation film being formed on the upper surface.

7. The method according to claim 3, wherein the diffusion plate provided in the step of providing comprises at least one of the following plurality of layers: a first metallic plate layer, a second layer comprised of an oxide of the metallic plate layer, and a third layer formed by a fluorination treatment of an upper layer of the second layer.

8. The method according to claim 3, wherein the processing chamber provided in the step of providing is formed from a same kind of metal as scattered from the substrate.

* * * * *